US012685107B2

(12) United States Patent
Wu et al.

(10) Patent No.: US 12,685,107 B2
(45) Date of Patent: Jul. 14, 2026

(54) ULTRA-THIN LAYERS BY SELECTIVE PASSIVATION

(71) Applicant: Applied Materials, Inc., Santa Clara, CA (US)

(72) Inventors: Zhiyuan Wu, San Jose, CA (US); Zheng Ju, Sunnyvale, CA (US); Feng Chen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 448 days.

(21) Appl. No.: 18/123,101

(22) Filed: Mar. 17, 2023

(65) Prior Publication Data

US 2024/0321633 A1 Sep. 26, 2024

(51) Int. Cl.
*H01L 21/768* (2006.01)

(52) U.S. Cl.
CPC .. *H01L 21/76861* (2013.01); *H01L 21/76831* (2013.01); *H01L 21/76876* (2013.01)

(58) Field of Classification Search
CPC ......... H01L 21/76834; H01L 21/76861; H01L 21/76831; H01L 21/76876; H01L 21/76877; H01L 21/76849
See application file for complete search history.

(56) References Cited

U.S. PATENT DOCUMENTS 5,468,597 A 11/1995 Calabrese et al.
6,042,999 A * 3/2000 Lin ...................... G03F 7/0035 430/316
7,291,284 B2 * 11/2007 Mirkin .................. G03F 7/0002 216/41
10,316,406 B2 * 6/2019 Lecordier ......... H01L 21/76834
11,923,198 B2 * 3/2024 Krishtab ................. G03F 7/265
12,148,660 B2 * 11/2024 Shaviv .............. H01L 21/76844
2005/0218523 A1 * 10/2005 Dubin ............... H01L 21/76879 257/E21.174
2010/0151491 A1 * 6/2010 Himmelhaus .... G01N 33/54393 435/395
2018/0076027 A1 3/2018 Tapily et al.
2019/0287807 A1 9/2019 Basu et al.
2019/0390340 A1 12/2019 Yu et al.
2020/0072825 A1 * 3/2020 Hosseini ............ G01N 27/3277
2020/0347493 A1 11/2020 Liu et al.
2020/0350204 A1 11/2020 Yu et al.
2022/0238323 A1 * 7/2022 Clark ................ H01L 21/76832
(Continued)

FOREIGN PATENT DOCUMENTS

WO 2020264170 A1 12/2020

OTHER PUBLICATIONS

PCT International Search Report and Written Opinion in PCT/US2022/036678 dated Oct. 28, 2022, 10 pages.
(Continued)

*Primary Examiner* — John M Parker
(74) *Attorney, Agent, or Firm* — SERVILLA WHITNEY LLC

(57) ABSTRACT

Methods for depositing ultra-thin films are disclosed. Some embodiments of the disclosure utilize ultra-thin films as barrier layers, liner layers, or nucleation layers to decrease interconnect resistance. Some embodiments advantageously provide continuous films with thicknesses of less than or equal to about 20 Å. Some embodiments advantageously provide films with decreased roughness.

16 Claims, 4 Drawing Sheets

(56) References Cited

U.S. PATENT DOCUMENTS

| | | | | |
|---|---|---|---|---|
| 2023/0154757 | A1 * | 5/2023 | Lionti | H01L 21/32 438/674 |
| 2024/0017290 | A1 * | 1/2024 | Zandi | B05D 1/185 |

OTHER PUBLICATIONS

Lux, Francois , et al., "Self-Assembled Monolayers Based on Phenanthroline-Gold(111) Bonding", Langmuir 2006, vol. 22, No. 26, pp. 10874-10876 [published on web: Nov. 10, 2006].

* cited by examiner

ULTRA-THIN LAYERS BY SELECTIVE PASSIVATION

TECHNICAL FIELD

Embodiments of the disclosure generally relate to methods of forming thin layers for semiconductor structures. More particularly, some embodiments of the disclosure are directed to methods of selectively deposition to reduce film thickness and roughness.

BACKGROUND

Generally, an integrated circuit (IC) refers to a set of electronic devices, e.g., transistors formed on a small chip of semiconductor material, typically, silicon. Typically, the IC includes one or more layers of metallization having metal lines to connect the electronic devices of the IC to one another and to external connections. Typically, layers of the interlayer dielectric materials are placed between the metallization layers of the IC for insulation.

As the size of the IC decreases, the spacing between the metal lines decreases. Typically, to manufacture an interconnect structure, a planar process is used that involves aligning and connecting one layer of metallization to another layer of metallization through metal vias.

Reducing the resistance of these via is critical for improved performance of the electronic device. Via resistance reduction can be controlled by minimizing the thickness of barrier/liner materials, thereby maximizing metal volume.

Yet, there is inherent difficulty in reducing barrier/liner thickness as these films are required to be continuous to maintain suitable performance. Accordingly, there is a need for ultra-thin layers.

SUMMARY

One or more embodiments of the disclosure are directed to a film deposition method comprising: depositing a non-continuous first portion of a film on a substrate surface, exposing the substrate surface and the first portion to a passivation agent to selectively passivate the first portion, and selectively deposing a second portion of the film on the substrate surface over the first portion of the film.

Additional embodiments of the disclosure are directed to a method of forming an interconnect structure. The method comprises depositing a first portion of an intermediate layer on a substrate surface with a feature formed therein. The feature extends a depth from a top to a metal bottom and bounded by dielectric sidewalls. The first portion is deposited on the dielectric sidewalls and is non-continuous. The substrate surface and the first portion are exposed to a passivation agent to selectively passivate the first portion. A second portion of the intermediate layer is selectively deposited on the substrate surface over the first portion.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
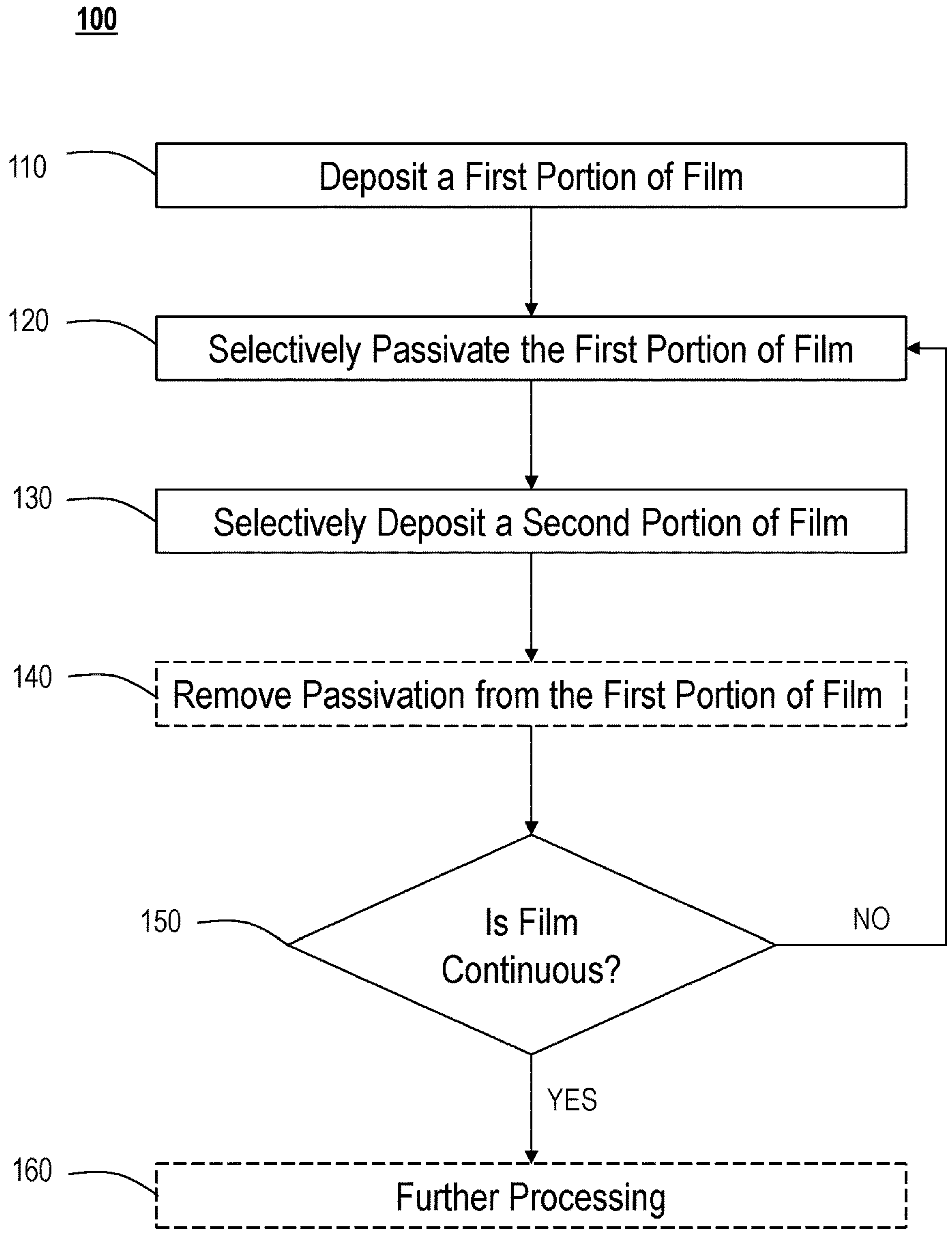
FIG. 1 illustrates a process flow diagram of a method according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap.

A metal can be grown by atomic layer deposition for many applications. One or more embodiments of the disclosure advantageously provide processes for deposition of metal-containing films. As used in this specification and the appended claims, the term "metal-containing film" refers to a film that comprises metal atoms and has greater than or equal to about 1 atomic % metal, 2 atomic % metal, 3 atomic % metal, 4 atomic % metal, 5 atomic % metal, 10 atomic % metal, 15 atomic % metal, 20% atomic metal, 25% atomic metal, 30% atomic metal, 35% atomic metal, 40% atomic metal, 45% atomic metal, 50% atomic metal, 55% atomic metal, 60% atomic metal, or 65% atomic metal. In some embodiments, the metal-containing film comprises one or more of a metal, a metal nitride, a metal carbide, or a metal oxide. The skilled artisan will recognize that the use of molecular formula like MO, where M is a metal, does not imply a specific stoichiometric relationship between the elements but merely the identity of the major components of the film. For example, MO refers to a film whose major composition comprises a metal and oxygen atoms. In some embodiments, the major composition of the specified film (i.e., the sum of the atomic percent of the specified atoms) is greater than or equal to about 95%, 98%, 99% or 99.5% of the film, on an atomic basis.

The phrase "metallic material surface" or "non-metallic material surface" as used herein refers to the surface of a metallic or non-metallic material, respectively. A non-metallic material, for the purposes of this disclosure, is any material that exhibits the properties of a poor conductor, or a good insulator. A non-metallic material may include metal atoms (e.g., tantalum nitride, titanium nitride) and still fall into the scope of non-metallic materials. In some embodiments, the term "conductive material" is used in place of metallic material. In some embodiments, the term "dielectric material" is used in place of non-metallic material.

The phrase "selectively depositing on a first surface over a second surface", and the like, as used herein means that a first amount or thickness is deposited on the first surface and a second amount or thickness is deposited on the second surface, where the second amount or thickness is less than the first amount or thickness, or, in some embodiments, no amount is deposited on the second surface.

The term "over" as used herein does not imply a physical orientation of one surface on top of another surface, rather a relationship of the thermodynamic or kinetic properties of the chemical reaction with one surface relative to the other surface. For example, selectively depositing a film onto a metallic material surface over a non-metallic material surface means that the film deposits on the metallic material surface and less or no film deposits on the non-metallic material surface; or that the formation of the film on the metallic material surface is thermodynamically or kinetically favorable relative to the formation of a film on the non-metallic material surface.

Reducing contact resistance (Rc) for 3 nm node (N3) and beyond semiconductor structures is critical. Accordingly, one or more embodiments of this disclosure are directed to methods of selectively forming a self-assembled monolayer (SAM) on a first surface of a substrate over a second surface. The substrate comprises a metallic material (conductive material) with a first surface and a non-metallic material (dielectric material) with a second surface. In some embodiments, the first surface may be described as a metallic material surface or conductive material surface. In some embodiments, the first surface comprises one or more of copper (Cu), cobalt (Co), ruthenium (Ru), tungsten (W), or molybdenum (Mo). In some embodiments, the first surface comprises one or more of tungsten (W), or molybdenum (Mo). In some embodiments, the second surface may be described as a non-metallic material surface or a dielectric material surface. In some embodiments, the method described herein have middle end of line (MEOL) and back end of line (BEOL) applications.

With reference to FIG. 1, one or more embodiments of the disclosure are directed to a method 100 of forming an electronic device. The method illustrated in FIG. 1 is representative of an integrated process.

FIGS. 2A-2D illustrate cross-sectional views of an exemplary device 200 during the processing method 100 according to one or more embodiments of the disclosure. FIG. 3 illustrates an exemplary substrate 300 for processing according to one or more embodiments of the disclosure.

Referring to FIG. 3, a substrate 310 is provided having a barrier layer 315, a metal liner 320, a conductive layer 325, an etch stop layer 330, and a dielectric layer 335 thereon. In one or more embodiments, the dielectric layer 335 has at least one feature 340. In some embodiments, the substrate 310 is a wafer, for example a semiconductor substrate.

Figure 2A:
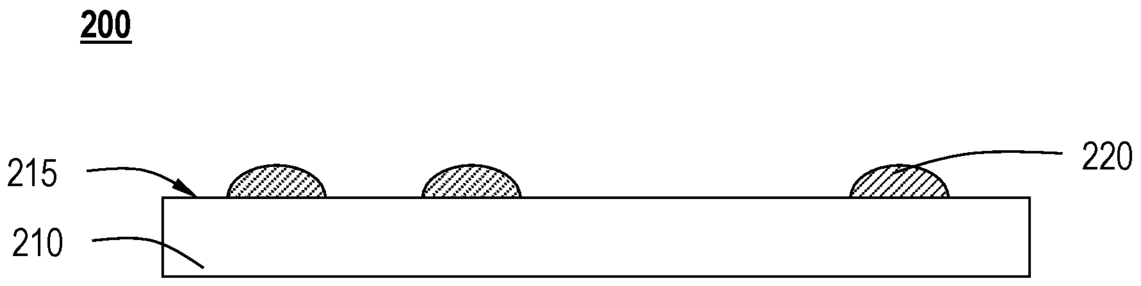
FIGS. 2A-2D illustrate cross-sectional views of an exemplary substrate during processing according to one or more embodiments of the disclosure.

For a clearer illustration, FIG. 2A shows a substrate 210 without a feature. One skilled in the art, however, will understand that there can be one or more features as illustrated in FIG. 3. Similarly, one skilled in the art will recognize that the disclosed methods may be performed on substrates which do not contain any features (as illustrated in FIGS. 2A to 2D).

As used herein, the term "feature" refers to any intentional surface irregularity. Suitable examples of features include, but are not limited to, trenches which have a top, two sidewalls, and a bottom, peaks which have a top and two sidewalls. Features can have any suitable aspect ratio (ratio of the depth of the feature to the width of the feature). In some embodiments, the aspect ratio is greater than or equal to about 1:1, 2:1, 3:1, 4:1, 5:1, 10:1, 15:1, 20:1, 25:1, 30:1, 35:1 or 40:1.

In some embodiments, as shown in FIG. 3, the feature 340 includes a first surface 345 and a second surface 350. In some embodiments, the first surface 345 is a bottom surface of the feature 340. In some embodiments, the second surface 350 is a sidewall of the feature 340. The shape of the feature 340 can be any suitable shape including, but not limited to, trenches, vias that, when filled with metal, transfer current between layers, and lines that transfer current within the same device layer. It will be appreciated that in one or more embodiments, the conductive layer 325 forms a metal line that transfers current within the same device layer. In some embodiments, the feature 340 defines a gap in the dielectric layer 335.

In one or more embodiments, the barrier layer 315 is a conformal layer. The barrier layer 315 may comprise any suitable material known to the skilled artisan and may be deposited by any suitable technique known to the skilled artisan. In some embodiments, the barrier layer is selected from titanium nitride (TiN) and tantalum nitride (TaN), or tungsten nitride (WN). In specific embodiments, the barrier layer 315 comprises tantalum nitride (TaN). In some embodiments, the barrier layer 315 is formed by ALD. In some embodiments, the barrier layer 315 prevents diffusion of material across itself to layers below.

In one or more embodiments, the metal liner 320 may comprise any suitable metal material known to the skilled artisan and may be deposited by any technique known to the skilled artisan. In one or more embodiments, the metal liner 320 comprises one or more of copper (Cu), cobalt (Co), ruthenium (Ru), iridium (Ir), rhodium (Rh), molybdenum (Mo), tungsten (W), aluminum (Al), nickel (Ni), and platinum (Pt). In one or more embodiments, the metal liner 320 comprises one or more of a single layer of tungsten (W) or a single layer of molybdenum (Mo). In some embodiments, the metal liner 320 comprises or consists essentially of tungsten or molybdenum. As used in this specification and the appended claims, the term "consists essentially of" means that the material is greater than or equal to about 95%, 98% or 99% of the stated material on an atomic basis.

In one or more embodiments, the conductive layer 325 comprises a metal or a metallic material. In some embodiments, the metal or metallic material can be any suitable metallic material. In some embodiments, the metallic materials of this disclosure are conductive materials. Suitable metallic materials include, but are not limited to, metals, conductive metal nitrides, conductive metal oxides, metal alloys, silicon, combinations thereof, and other conductive materials.

As used in this specification and the appended claims, the term "oxide" or the like means that the material contains the specified element(s). The term should not be interpreted to imply a specific ratio of elements. Accordingly, an "oxide" or the like may comprise a stoichiometric ratio of elements or a non-stoichiometric ratio of elements.

In one or more embodiments, the metal or metallic material may comprise any suitable metal known to the skilled artisan. In some embodiments, the metal or metallic material is selected from one or more of copper (Cu), cobalt (Co), ruthenium (Ru), iridium (Ir), rhodium (Rh), molybdenum (Mo), tungsten (W), aluminum (Al), nickel (Ni), and platinum (Pt). In some embodiments, the metal or metallic material consists essentially of copper (Cu), cobalt (Co), ruthenium (Ru), iridium (Ir), rhodium (Rh), molybdenum (Mo), tungsten (W), aluminum (Al), nickel (Ni), or platinum (Pt). In some embodiments, the metal or metallic material consists essentially of copper, cobalt, ruthenium, tungsten, or molybdenum. In some embodiments, the metallic material comprises or consists essentially of tungsten or molybdenum. In some embodiments, the metallic material comprises or consists essentially of copper.

In one or more embodiments, the etch stop layer 330 comprises any suitable material known to the skilled artisan. In one or more embodiments, the etch stop layer 330 comprises one or more of silicon nitride (SiN), silicon carbide (SiC), aluminum oxide ($AlO_x$), and aluminum nitride (AlN). In some embodiments, the etch stop layer 330 may be deposited using a technique selected from CVD, PVD, and ALD.

In one or more embodiments, a portion of the metal liner 320 and the etch stop layer 330 are removed and the bottom first surface 345 of the at least one feature 340 is exposed. In some embodiments, the bottom first surface 345 is a portion of the top surface of the conductive material 325, such that a portion of the conductive material 325 is exposed.

In one or more embodiments, the dielectric layer 335 can be any suitable material. In some embodiments, the dielectric layer 335 insulates adjacent devices and prevent leakage. Suitable dielectric materials include, but are not limited to, silicon oxides (e.g., $SiO_2$), silicon nitrides (e.g., SiN), silicon carbides (e.g., SiC), and combinations thereof (e.g., SiCON). Suitable dielectric materials further include aluminum oxide, aluminum nitride, and low-k dielectric materials. In some embodiments, the dielectric material consists essentially of silicon dioxide ($SiO_2$). In some embodiments, the dielectric layer 335 comprises silicon nitride. In some embodiments, the dielectric layer 335 consists essentially of silicon nitride.

In one or more embodiments, the dielectric layer 335 is deposited using any suitable deposition technique, such as, but not limited to, chemical vapor deposition ("CVD"), physical vapor deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

Referring to FIG. 1, an exemplary method 100 begins with operation 110. At operation 110, a first portion 220 of a film is deposited on the surface 215 of a substrate 210. The first portion 220 of the film is non-continuous.

As used in this disclosure and the appended claims, a non-continuous film has gaps, holes or other openings which expose the underlying substrate. In contrast, a continuous film for which less than 5%, 2%, 1% or 0.5% of the surface area of the underlying material is exposed. In some embodiments, the thickness of the first portion 220 is less than or equal to about 5 Å.

In some embodiments, the first portion 220 of the film is deposited on the sidewall of a feature 340. In some embodiments, the film comprises a barrier layer, liner layer, or metal nucleation layer.

In some embodiments, the film is a barrier and comprises or consists essentially of TaN, doped TaN, WN, MoN, or TiN. In some embodiments, the film is a barrier and consists essentially of TaN or TiN. In some embodiments, the film is a liner layer and comprises or consists essentially of Ti, W, WN, Mo, MoN, Co or Ru. In some embodiments, the film is a liner layer and consists essentially of Co and/or Ru. In some embodiments, the film is a metal nucleation layer and comprises or consists essentially of W, Mo, Co or Cu.

Next, at operation 120, the substrate 210 and the first portion 220 of the film are exposed to a passivation agent to selectively passivate the first portion 220 of the film.

In some embodiments, "selectively" means that the subject material forms on the selected surface at a rate greater than or equal to about 1.5×, 2×, 3×, 4×, 5×, 7×, 10×, 15×, 20×, 25×, 30×, 35×, 40×, 45×, or 50× the rate of formation on the non-selected surface. Stated differently, the selectivity of the stated process for the selected surface relative to the non-selected surface is greater than or equal to about 3:2, 2:1, 3:1, 4:1, 5:1, 7:1, 10:1, 15:1, 20:1, 25:1, 30:1, 35:1, 40:1, 45:1, or 50:1.

Figure 2B:
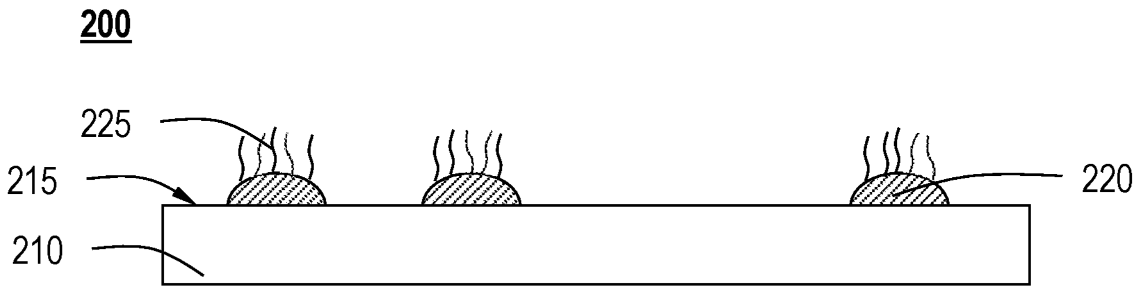
Figure 2C:
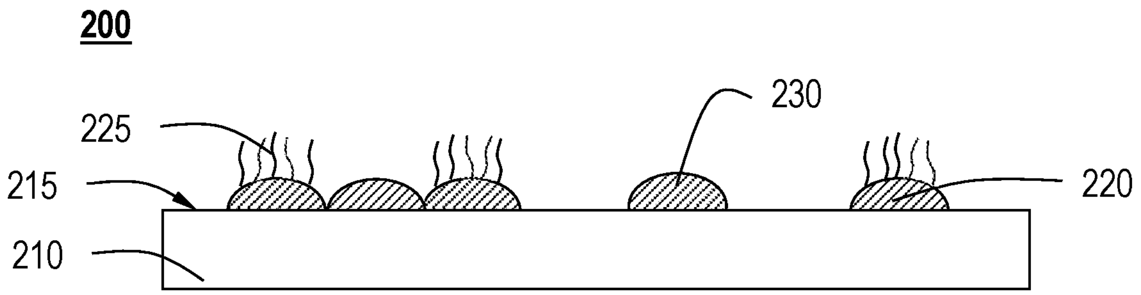
Figure 2D:
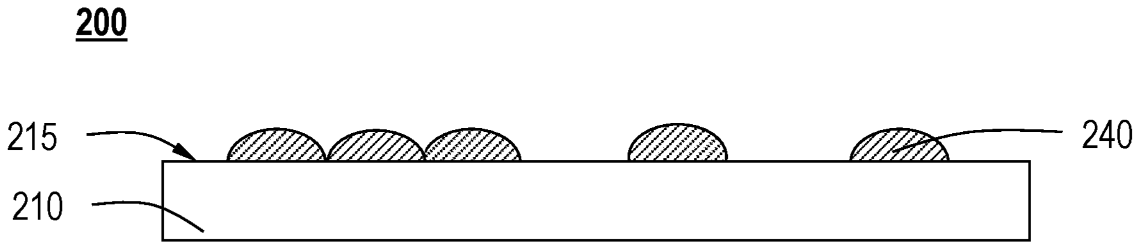
Figure 3:
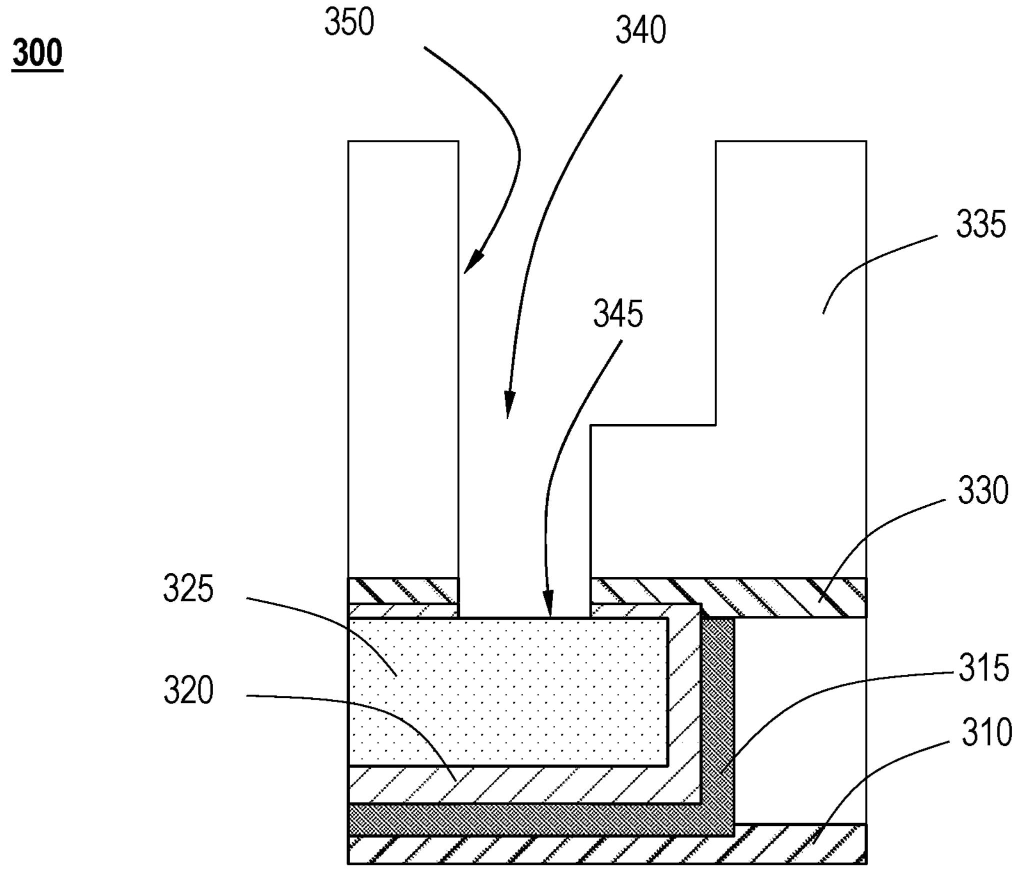
FIG. 3 illustrates a cross-sectional view of an exemplary substrate according to one or more embodiments of the disclosure.

As shown in FIG. 2B, in some embodiments, the passivation agent comprises a blocking compound with at least one reactive head group and at least one carbonaceous tail group (shown as wavy line), also known as a self-assembled monolayer or SAM.

The substrate 210 may be exposed to the passivation agent (also referred to as SAM precursor or SAM molecule) by any suitable process. In some embodiments, the substrate is exposed to the SAM precursor by a chemical vapor deposition (CVD) process. In some embodiments, the substrate is exposed to the SAM precursor by an ALD process. In some embodiments, the substrate is exposed to the SAM precursor by an immersion or "wet" process.

The SAM precursor may be any compound capable of selectively forming a SAM layer 225 on the first portion 220 over the substrate surface 215. In general, the SAM precursor comprises at least one blocking molecule. A blocking molecule has the general formula A-L, where A is a reactive head group and L is a tail group.

As used in this manner, the "head group" is any chemical moiety that associates with the first portion 220 and the "tail group" is any chemical moiety that extends away from the first portion 220.

In some embodiments, the film comprises a dielectric material and A is selected from the group consisting of $(R_2N)_{(3-a)}R'_aSi$—, $X_3Si$— and $(RO)_3Si$—, where each R and R' is independently selected from C1-C6 alkyl, C1-C6 cycloakyl and C1-C6 aryl, a is an integer from 0 to 2, and each X is independently selected from halogens.

In some embodiments, the film comprises a conductive material and A is selected from the group consisting of $(R''O)_2OP$—, HS— and $H_3Si$—, where each R" is independently selected from hydrogen, C1-C6 alkyl, C1-C6 cycloakyl and C1-C6 aryl. In some embodiments, the head group comprises $(HO)_2OP$—.

Some of the reactive head groups comprise more than one reactive moiety in a single reactive head group (e.g. HsSi— may bond up to three times with the surface) which is attached to tail group, L. In some embodiments, A comprises a reactive group connected to more than one tail group L. In these embodiments, each of the tail groups may be the same or different.

In some embodiments, L is $—(CH_2)_nCH_3$ and n is an integer from 3 to 24. In some embodiments, L is $—(CH_2)_n—$ and n is an integer from 4 to 18 and a reactive group is on the end of the tail group opposite the head group. In some embodiments, the tail group may be branched. In some embodiments, the tail group may be substituted. In some embodiments, the tail group may be unsaturated. In some embodiments, the tail group may comprise cycloalkyl or aryl groups.

In some embodiments, the blocking compound includes a reactive group Z. The reactive group Z of some embodiments is a group comprising one or more reactive moiety selected from alkenes, alkynes, alcohols, carboxylic acids, aldehydes, acyl halides, amines, amides, cyanates, isocyanates, thiocyanates, isothiocyanates, or nitriles.

In some embodiments, the blocking molecule comprises more than one reactive group. In some embodiments, A is linked to more than one tail group each terminated with a reactive group, such that a blocking molecule comprises more than one reactive group. In some embodiments, L is branched, such that a blocking molecule comprises more than one reactive group.

In some embodiments, the blocking molecule comprises more than one reactive moiety and the reactive moieties are positioned in a linear fashion. In some embodiments, Z comprises more than one reactive moiety and the reactive moieties are positioned in a branched fashion. As used in this manner, reactive moieties positioned in a linear fashion are end-to-end. As used in this manner, reactive moieties positioned in a branched fashion are not positioned end-to-end. In some embodiments, the reactive moieties may be separated by intervening atoms but still be considered end-to-end.

For example, Compound I contains one reactive moiety. Compounds II and III each contain two reactive moieties. Compound II has reactive moieties positioned in a linear fashion. Compound III has reactive moieties positioned in a branched fashion.

(I)

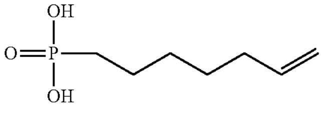

-continued (II)

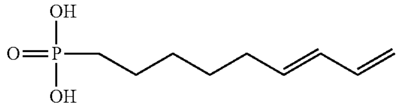

(III)

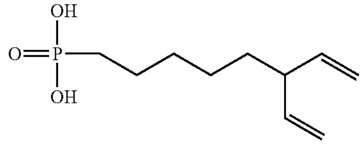

In some embodiments, the tail groups associate with each other through relatively slow van der Waals interaction. In some embodiments, the tail groups can be the same or different so that a homogeneous or heterogeneous SAM can be formed. In some embodiments, the SAM precursor comprises at least two different blocking molecules so that a heterogeneous SAM is formed.

The SAM precursor can be delivered to the substrate as a single compound or sequential exposures of multiple compounds to form the SAM layer 225. In some embodiments, the first portion 220 is exposed to a single compound that assembles on the surface in an ordered or semi-ordered manner.

In one or more embodiments, the substrate 210 can be exposed to the SAM precursor at any suitable flow rate to form the self-assembled monolayer (SAM) 225. In some embodiments, the substrate 210 is exposed to the SAM precursor at a flow rate in a range of from 50 sccm to 2000 sccm, from 100 sccm to 2000 sccm, from 500 sccm to 2000 sccm, from 1000 sccm to 2000 sccm, from 1500 sccm to 2000 sccm, from 50 sccm to 100 sccm, from 75 sccm to 100 sccm. In some embodiments, the flow rate of the SAM precursor is less than or equal to 2000 sccm, less than or equal to 1500 sccm, less than or equal to 1000 sccm, less than or equal to 600 sccm, less than or equal to 500 sccm, less than or equal to 400 sccm, less than or equal to 300 sccm, less than or equal to 250 sccm, less than or equal to 200 sccm, less than or equal to 150 sccm, less than or equal to 100 sccm, less than or equal to 75 sccm, or less than or equal to 50 sccm.

In some embodiments, the substrate 210 is soaked in a vapor of the SAM precursor. In some embodiments, the substrate 210 is soaked in a liquid of the SAM precursor. In some embodiments, the soak period can be any suitable period for forming the self-assembled monolayer (SAM) 225. In some embodiments, the soak period is greater than or equal to 10 s, greater than or equal to 20 s, greater than or equal to 30 s, greater than or equal to 45 s, greater than or equal to 60 s, greater than or equal to 80 s, greater than or equal to 120 s, greater than or equal to 150 s, or greater than or equal to 200 s.

In one or more embodiments, the SAM precursor is liquid at the operating temperature and/or operating pressure. In one or more embodiments, the SAM precursor is solid at the operating temperature and/or operating pressure. In some embodiments, the SAM precursor is stored in an ampoule or a cylinder, from which the SAM precursor is delivered to the substrate 210. In some embodiments, the SAM precursor has a vapor pressure in a range of from 0.1 Torr to 150 Torr, from 0.1 Torr to 100 Torr, from 0.1 Torr to 50 Torr, from 0.1 Torr to 10 Torr, from 0.1 Torr to 1 Torr, from 0.1 Torr to 0.5 Torr, from 0.5 Torr to 150 Torr, from 0.5 Torr to 100 Torr, from 0.5 Torr to 50 Torr, from 0.5 Torr to 10 Torr, from 0.5 Torr to 1 Torr, from 1 Torr to 150 Torr, from 1 Torr to 100 Torr, from 1 Torr to 50 Torr, from 1 Torr to 10 Torr, from 10 Torr to 150 Torr, from 10 Torr to 100 Torr, from 10 Torr to 50 Torr, from 50 Torr to 150 Torr, from 50 Torr to 100 Torr, or from 100 Torr to 150 Torr at the operating temperature and/or operating pressure. In some embodiments, the SAM precursor has a vapor pressure greater than or equal to about 0.1 Torr at the operating temperature and/or operating pressure.

In one or more embodiments, the SAM precursor further comprises a carrier gas. In some embodiments, the carrier gas is a non-reactive gas. In some embodiments, the carrier gas comprises a noble gas. In some embodiments, the noble gas includes one or more of helium (He), neon (Ne), or argon (Ar). In some embodiments, the carrier gas comprises argon (Ar).

In some embodiments, a flow of the carrier gas is configured to carry the SAM precursor from a container to the substrate 210. In some embodiments, the flow rate of the argon (Ar) gas that is configured to carry the SAM precursor to the substrate 210 is controlled.

In one or more embodiments, the substrate is independently maintained at an operating pressure during one or more operations of the method 100. In some embodiments, the operating pressure is less than or equal to 100 Torr, less than or equal to 80 Torr, less than or equal to 70 Torr, less than or equal to 60 Torr, less than or equal to 50 Torr, less than or equal to 40 Torr, less than or equal to 30 Torr, less than or equal to 20 Torr, less than or equal to 15 Torr, less than or equal to 10 Torr, less than or equal to 5 Torr, less than or equal to 1 Torr, less than or equal to 500 mTorr, less than or equal to 200 mTorr, less than or equal to 100 mTorr, or less than or equal to 50 mTorr. In some embodiments, the operating pressure is 10 Torr, 20 Torr, 30 Torr, 40 Torr, or 50 Torr. In some embodiments, the substrate 210 is maintained at a pressure in a range of from 1 mTorr to 100 Torr, from 1 mTorr to 80 Torr, from 1 mTorr to 60 Torr, from 1 mTorr to 40 Torr, from 1 mTorr to 20 Torr, from 1 mTorr to 10 Torr, from 1 mTorr to 5 Torr, from 1 mTorr to 1 Torr, from 1 mTorr to 500 mTorr, from 1 mTorr to 200 mTorr, from 1 mTorr to 100 mTorr, from 1 mTorr to 50 Torr, from 500 mTorr to 100 Torr, from 500 mTorr to 80 Torr, from 500 mTorr to 60 Torr, from 500 mTorr to 40 Torr, from 500 mTorr to 20 Torr, from 500 mTorr to 10 Torr, from 500 mTorr to 5 Torr, from 500 mTorr to 1 Torr, from 1 Torr to 100 Torr, from 1 Torr to 80 Torr, from 1 Torr to 60 Torr, from 1 Torr to 40 Torr, from 1 Torr to 20 Torr, from 1 Torr to 10 Torr, from 1 Torr to 5 Torr, from 10 Torr to 100 Torr, from 10 Torr to 80 Torr, from 10 Torr to 60 Torr, from 10 Torr to 40 Torr, from 10 Torr to 20 Torr, from 20 Torr to 100 Torr, from 20 Torr to 80 Torr, from 20 Torr to 60 Torr, or from 20 Torr to 40 Torr during depositing the self-assembled monolayer (SAM) 225.

In some embodiments, the temperature of the substrate is controlled during the method 100. The temperature of the substrate may also be referred to as the operating temperature. In some embodiments, the operating temperature is less than or equal to 450° C., less than or equal to 400° C., less than or equal to 350° C., less than or equal to 300° C., less than or equal to 275° C., less than or equal to 250° C., less than or equal to 225° C., less than or equal to 200° C., less than or equal to 150° C., less than or equal to 100° C., or less than or equal to 80° C. In some embodiments, the operating temperature in a range of from 60° C. to 450° C., from 60° C. to 350° C., from 60° C. to 250° C., from 60° C. to 150° C., from 60° C. to 100° C., from 100° C. to 450° C., from 100° C. to 350° C., from 100° C. to 250° C., from 100° C. to 200° C., from 200° C. to 450° C., from 200° C. to 350° C., from 200° C. to 300° C., from 300° C. to 450° C., from 300° C. to 350° C., or from 400° C. to 450° C. during depositing the self-assembled monolayer (SAM) 225.

In some embodiments, the passivation agent comprises a poisoning agent. As used in this regard, a poisoning agent reacts with the first portion 220 to prevent deposition of the second portion 230 on the first portion 220 without forming a separate layer. In some embodiments, the passivation agent comprises an alkyl halide. In some embodiments, the alkyl halide comprises or consists essentially of iodoethane ($C_2H_5I$) or diiodomethane ($CH_2I_2$).

Next, at operation 130, a second portion 230 of the film is selectively deposited on the substrate surface 215 over the first portion 220 of the film.

Without being bound by theory, it is believed that by minimizing deposition of the second portion 230 on the first portion 220 a continuous film of minimal thickness can be formed. These thin films advantageously provide superior barrier, liner and/or nucleation properties with minimal impact on interconnect resistance.

Next, at optional operation 140, the passivation of the first portion 220 of the film is removed.

In some embodiments, removing the passivation of the first portion 220 may be performed by a thermal decomposition process (with desorption of any byproducts) or by a compatible $O_2$ plasma ashing process. In some embodiments, the passivation of the first portion 220 may be removed by a thermal soak process. In some embodiments, the thermal soak comprises one or more of $H_2$, $NH_3$ or Ar. In some embodiments, the passivation of the first portion 220 may be removed by an etch process. In some embodiments, the etch process may comprise any suitable means, including but not limited to, plasma cleaning processes. In one or more embodiments, the passivation of the first portion 220 is removed by a plasma treatment. In some embodiments, the plasma comprises one or more of hydrogen ($H_2$), nitrogen ($N_2$), ammonia ($NH_3$) or argon (Ar) plasma. In some embodiments, the plasma is a formed directly above the substrate in the processing chamber. In some embodiments, the plasma is formed remotely.

As used in this specification, a plasma comprising hydrogen, nitrogen, or argon, means a plasma formed from the molecular form of the species named. In some embodiments, the plasma consists essentially of hydrogen, nitrogen, argon, or combinations thereof. In some embodiments, the self-assembled monolayer (SAM) 225 is removed without causing substantially damage to the first portion 220 or the substrate 210.

The power of the plasma may be varied depending on the composition, packing and/or thickness of the self-assembled monolayer (SAM) and composition and/or thickness of the surrounding materials. In some embodiments, the plasma power is in a range of about 20 W to about 500 W, in a range of about 20 W to about 400 W, in a range of about 20 W to about 250 W, in a range of about 50 W to about 500 W, in a range of about 100 W to about 500 W, in a range of about 100 W to about 450 W, in a range of about 100 W to about 500 W, or in a range of about 200 W to about 400 W. In some embodiments, the plasma power is about 50 W, about 200 W or about 400 W.

The duration of the plasma exposure may be varied depending on the composition, packing and/or thickness of the self-assembled monolayer (SAM) 225 and composition and/or thickness of the surrounding materials. In some embodiments, the substrate is exposed to the plasma for a time period in a range of about 2 s to about 60 s, in a range of about 3 s to about 30 s, or in a range of about 5 s to about 10 s. In some embodiments, the substrate is exposed to the plasma for a time period of about 3 s, about 5 s, about 10 s, or about 30 s.

Next, at decision point 150, it is determined whether the film is continuous. If so, the method 100 may continue to optional further processing at 160. If not, the method may return to operation 120. Upon return to operation 120, the combined first portion 220 and second portion 230 (shown as 240) are referred to as the first portion. In this way, the method 100 repeats to deposit additional material of the film (referred to as the second portion) until the film is continuous.

In some embodiments, after repeated cycles, the film is continuous with a thickness of less than or equal to about 20 Å, less than or equal to about 10 Å, or less than or equal to about 5 Å.

Without being bound by theory, it is believed that the films deposited by the disclosed method are smoother than films deposited in bulk. For example, a 10 Å film bulk deposited without disclosed passivation may have a roughness (Ra) of about 2.5 Å. In contrast, the disclosed methods may be able to reduce the roughness of a 10 Å film to less than or equal to about 1.5 Å.

Figure 4:
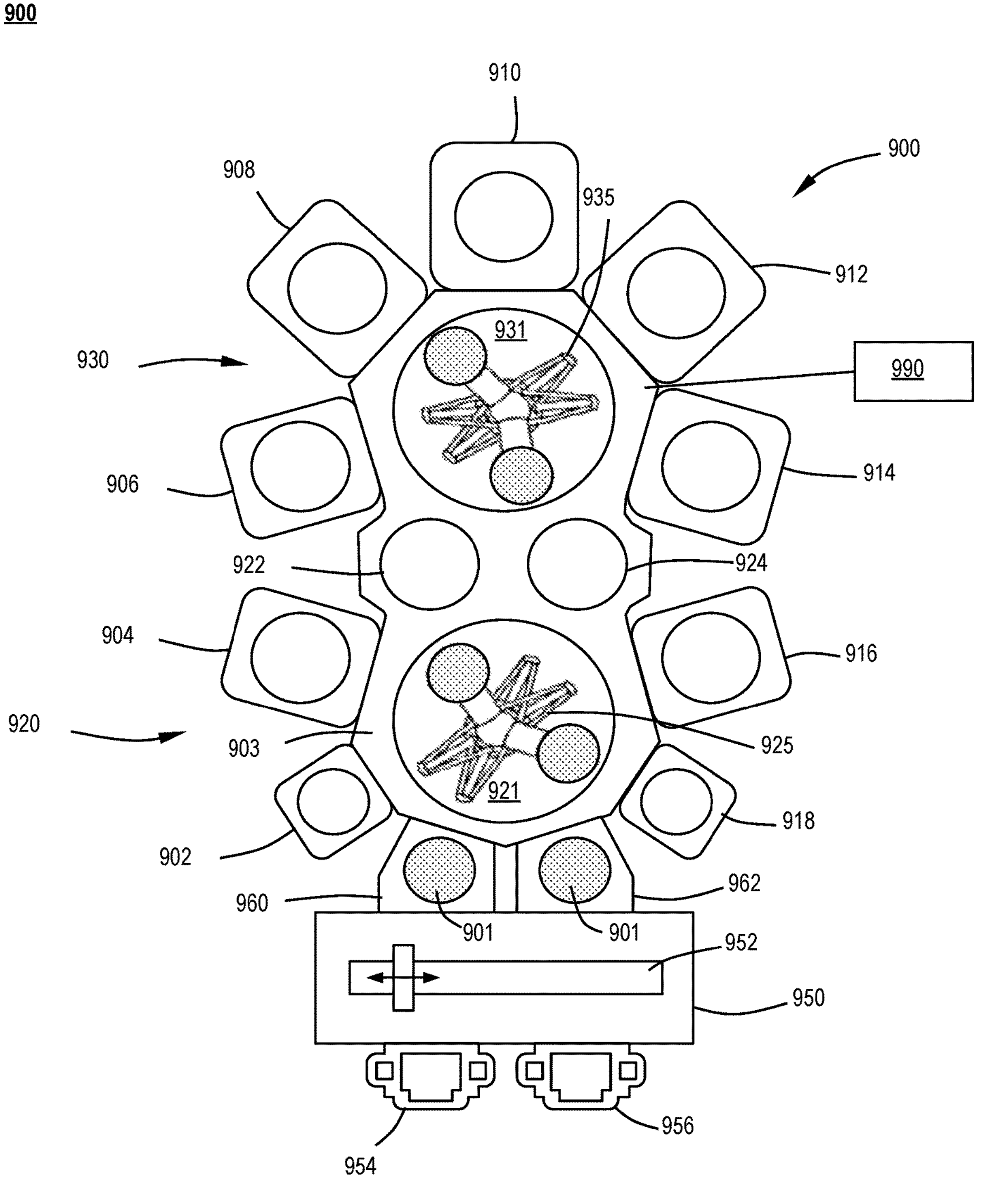
FIG. 4 illustrates an exemplary cluster tool according to one or more embodiments of the disclosure.

Additional embodiments of the disclosure are directed to processing tools 900 for the formation of the devices and methods described, as shown in FIG. 4. A variety of multi-processing platforms, including the Centura®, Dual ACP, Producer® GT, and Endura® platform, available from Applied Materials® as well as other processing systems may be utilized. In one or more embodiments, the cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a selective metal deposition chamber; a barrier metal deposition chamber; a metal deposition chamber; a PVD metal deposition chamber; a CVD metal deposition chamber; a self-assembled monolayer (SAM) deposition chamber; a liner metal deposition chamber; a plasma chamber; a pre-clean chamber; an etching chamber; transfer space(s), a wafer orienter/degas chamber, a cryo cooling chamber, and the like. The particular arrangement of process chambers and components can be varied depending on the cluster tool and should not be taken as limiting the scope of the disclosure.

In one or more embodiments, the cluster tool 900 includes a self-assembled monolayer (SAM) deposition chamber to expose the substrate to SAM precursor and form a self-assembled monolayer (SAM) 225. In one or more embodiments, the cluster tool 900 includes a pre-cleaning chamber connected to the central transfer station.

In the embodiment shown in FIG. 4, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In one or more embodiments, the processing tool 900 comprises a central transfer station 921, 931 comprising at least one robot 925, 935 configured to move a wafer; one or more of a deposition station, a self-assembled monolayer (SAM) formation station, and/or a SAM removal station, connected to the central transfer station; an optional pre-clean station connected to the central transfer station; and at least one controller connected to the one or more of the central transfer station, deposition station, a SAM formation station, a SAM removal station, or the optional pre-clean station. In one or more embodiments, the at least one controller has at least one configuration selected from: a configuration to move the wafer between stations using the robot; a configuration to deposit a first portion of the film; a configuration to form a self-assembled monolayer (SAM); a configuration to deposit a second portion of the film; a configuration to remove a SAM layer; and/or a configuration to pre-clean the wafer.

In one or more embodiments, a processing tool comprises: a pre-clean chamber having a substrate support therein; a deposition chamber; a self-assembled monolayer (SAM) formation chamber; optionally, a SAM removal chamber; a robot configured to access the pre-clean chamber, the deposition chamber, the SAM formation chamber, and the optional SAM removal chamber; and a controller connected to the pre-clean chamber, the deposition chamber, the self-assembled monolayer (SAM) formation chamber, and the optional SAM removal chamber, and the robot, the controller having one or more configurations selected from: cleaning a substrate, depositing a first portion of a film on the substrate, forming a self-assembled monolayer (SAM), depositing a second portion of a film on the substrate, and optionally removing the self-assembled monolayer (SAM).

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method comprising:

depositing a first portion of a film on a substrate surface, the first portion being non-continuous;

exposing the substrate surface and the first portion to a passivation agent to selectively passivate the first portion;

selectively deposing a second portion of the film on the substrate surface over the first portion of the film;

removing the passivation agent from the first portion; and repeating exposing the substrate surface and the first portion to the passivation agent and selectively depositing the second portion to grow a continuous film.

2. The method of claim 1, wherein the substrate surface has a feature formed therein, the feature extending a depth from a top to a bottom and bounded by sidewalls and the film is deposited on the sidewalls.

3. The method of claim 2, wherein the bottom comprises a metal material.

4. The method of claim 3, wherein the metal material comprises Cu, Co, W, Mo, or Ru.

5. The method of claim 1, wherein the film comprises a barrier layer, a liner layer, or a metal nucleation layer.

6. The method of claim 1, wherein the film is a barrier layer and consists essentially of TaN, doped TaN, WN, MoN, or TiN.

7. The method of claim 1, wherein the film is a liner layer and consists essentially of Ti, W, WN, MoN, Co or Ru.

8. The method of claim 1, wherein the film is a metal nucleation layer and consists essentially of W, Mo, Co or Cu.

9. The method of claim 1, wherein the passivation agent comprises a blocking compound with at least a reactive head group and carbonaceous tail group.

10. The method of claim 1, wherein the continuous film has a thickness of less than 2 nm.

11. A method of forming an interconnect structure, the method comprising:

depositing a first portion of an intermediate layer on a substrate surface with a feature formed therein, the feature extending a depth from a top to a metal bottom and bounded by dielectric sidewalls, the first portion deposited on the dielectric sidewalls and being non-continuous;

exposing the substrate surface and the first portion to a passivation agent to selectively passivate the first portion;

selectively depositing a second portion of the intermediate layer on the substrate surface over the first portion;

removing the passivation agent from the first portion; and repeating exposing the substrate surface and the first portion to the passivation agent and selectively depositing the second portion to grow a continuous film.

12. The method of claim 11, wherein the metal bottom comprises Cu, Co, W, Mo, or Ru.

13. The method of claim 11, wherein the intermediate layer is a barrier layer comprising titanium nitride, tantalum nitride, or molybdenum nitride.

14. The method of claim 11, wherein the intermediate layer is a liner layer comprising cobalt, ruthenium, or molybdenum.

15. The method of claim 11, wherein the continuous film has a thickness of less than 2 nm.

16. The method of claim 11, further comprising depositing a metal fill material within the feature on the continuous film.

* * * * *